(12) United States Patent
Morita et al.

(10) Patent No.: US 10,157,753 B2
(45) Date of Patent: Dec. 18, 2018

(54) WIRING BOARD, ELECTRONIC DEVICE, AND ELECTRONIC MODULE

(71) Applicant: KYOCERA Corporation, Kyoto-shi, Kyoto (JP)

(72) Inventors: Yukio Morita, Kyoto (JP); Kenji Sugimoto, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 15/513,704

(22) PCT Filed: Sep. 25, 2015

(86) PCT No.: PCT/JP2015/077102
§ 371 (c)(1),
(2) Date: Mar. 23, 2017

(87) PCT Pub. No.: WO2016/047755
PCT Pub. Date: Mar. 31, 2016

(65) Prior Publication Data
US 2017/0294322 A1    Oct. 12, 2017

(30) Foreign Application Priority Data
Sep. 26, 2014    (JP) .................. 2014-196858

(51) Int. Cl.
*H05K 7/00* (2006.01)
*H05K 1/11* (2006.01)
(Continued)

(52) U.S. Cl.
CPC ........ *H01L 21/563* (2013.01); *H01L 21/4846* (2013.01); *H01L 23/04* (2013.01); *H01L 23/13* (2013.01); *H01L 23/49805* (2013.01); *H01L 23/49811* (2013.01); *H01L 23/49822* (2013.01); *H01L 23/49827* (2013.01); *H01L 23/49838* (2013.01); *H01L 23/49866* (2013.01); *H01L 33/486* (2013.01); *H01P 3/087* (2013.01);
(Continued)

(58) Field of Classification Search
CPC .... H05K 1/02; H05K 1/0296; H05K 2201/20; H05K 1/00; H05K 1/117
USPC ........ 361/748, 777, 784, 790; 174/250, 255, 174/261, 267
See application file for complete search history.

(56) References Cited

U.S. PATENT DOCUMENTS

2014/0151108 A1* 6/2014 Mikami ................. H05K 1/111
174/267
2016/0198561 A1* 7/2016 Tsunemi ................. H01L 23/13
174/250

FOREIGN PATENT DOCUMENTS

CN    103703871 A    4/2014
JP    2002-158509 A    5/2002
(Continued)

Primary Examiner — Binh Tran
(74) Attorney, Agent, or Firm — Volpe and Koenig, P.C.

(57) ABSTRACT

A wiring board (1) includes an insulating substrate (11) having a cutout (12) opened in a main surface and a side surface of the insulating substrate (11), and an inner electrode (13) formed on an inner surface of the cutout (12). The inner electrode (13) includes a plurality of metal layers. The inner electrode (13) includes, as an intermediate layer, at least one metal layer (17b) selected from the group consisting of a nickel layer, a chromium layer, a platinum layer, and a titanium layer, and includes a gold layer as an outermost layer (17a). The metal layer (17b) is exposed at an outer edge portion of the inner electrode (13).

8 Claims, 15 Drawing Sheets

(51) Int. Cl.
*H01L 21/56* (2006.01)
*H01L 23/04* (2006.01)
*H01L 23/13* (2006.01)
*H01L 23/498* (2006.01)
*H01P 3/08* (2006.01)
*H01L 21/48* (2006.01)
*H01L 33/48* (2010.01)
*H05K 1/00* (2006.01)
*H05K 1/18* (2006.01)

(52) U.S. Cl.
CPC ...... *H05K 1/11* (2013.01); *H01L 2224/16225* (2013.01); *H01L 2224/48091* (2013.01); *H01L 2224/48227* (2013.01); *H01L 2924/181* (2013.01)

(56) References Cited

FOREIGN PATENT DOCUMENTS

WO 2013/180247 A1 12/2013
WO 2014/104300 A1 7/2014

\* cited by examiner (a)

(b)

(a)

(b)

(a)

(b)

(a)

(b)

WIRING BOARD, ELECTRONIC DEVICE, AND ELECTRONIC MODULE

FIELD

The present invention relates to a wiring board, an electronic device, and an electronic module.

BACKGROUND

Wiring boards known in the art may have wiring conductors arranged either inside or on the surface of an insulating substrate, cutouts between side surfaces and the lower surface of the insulating substrate, and inner electrodes arranged on the inner surfaces of the cutouts and connected to the wiring conductors. When an electronic device including an electronic component and a wiring board is joined to, for example, a module substrate by soldering, the inner electrodes are joined to the module substrate with solder (refer to Japanese Unexamined Patent Application Publication No. 2002-158509).

BRIEF SUMMARY

Technical Problem

Wiring boards nowadays have higher circuit densities and use thin film deposition to form wiring conductors and other parts on the surface of an insulating substrate. However, inner electrodes formed by thin film deposition on the inner surfaces of cutouts can have lower adhesion than wiring conductors arranged on the surface of the insulating substrate. In joining the inner electrodes of the wiring board to the connection pads of the module substrate by soldering, the solder can be applied onto the outer edge portions of the inner electrodes. Such solder can transfer stress caused by the difference in thermal expansion between the wiring board and the module substrate to the outer edge portions of the inner electrodes. The inner electrodes can then come off the insulating substrate.

Solution to Problem

A wiring board according to a first aspect of the present invention includes an insulating substrate having a cutout opened in a main surface and a side surface of the insulating substrate, and an inner electrode arranged on an inner surface of the cutout. The inner electrode includes a plurality of metal layers. The inner electrode includes, as an intermediate layer, at least one metal layer selected from the group consisting of a nickel layer, a chromium layer, a platinum layer, and a titanium layer, and includes a gold layer as an outermost layer. The at least one metal layer is exposed at an outer edge portion of the inner electrode.

An electronic device according to a second aspect of the present invention includes the wiring board with the above structure, and an electronic component mounted on the wiring board and electrically connected to the inner electrode.

An electronic module according to a third aspect of the present invention includes a module substrate including a connection pad on a main surface of the module substrate, and the electronic device having the above structure and including the inner electrode connected to the connection pad with solder.

Advantageous Effects

The wiring board according to the first aspect of the present invention includes an insulating substrate having a cutout opened in a main surface and a side surface of the insulating substrate, and an inner electrode arranged on an inner surface of the cutout. The inner electrode includes a plurality of metal layers. The inner electrode includes, as an intermediate layer, at least one metal layer selected from the group consisting of a nickel layer, a chromium layer, a platinum layer, and a titanium layer, and includes a gold layer as an outermost layer. The at least one metal layer is exposed at an outer edge portion of the inner electrode. This structure prevents solder from being applied onto the outer edge portion of the inner electrode. In joining the inner electrode of the wiring board to the module substrate with solder, this structure prevents the solder from transferring stress caused by the difference in thermal expansion between the wiring board and the module substrate to the outer edge portion of the inner electrode. This reduces the possibility of the inner electrode coming off the insulating substrate. The wiring board can thus be small and have high circuit density and have highly reliable electrical connection to the module substrate over a long period of time.

The electronic device according to the second aspect of the present invention includes the wiring board with the above structure, and an electronic component mounted on the wiring board and electrically connected to the inner electrode. This electronic device has high electrical reliability.

The electronic module according to the third aspect of the present invention includes a module substrate including a connection pad on a main surface of the module substrate, and the electronic device having the above structure and including the inner electrode connected to the connection pad with solder. This electronic module has highly reliable electrical connection between the wiring board and the module substrate over a long period of time.

DETAILED DESCRIPTION

Figure 1:
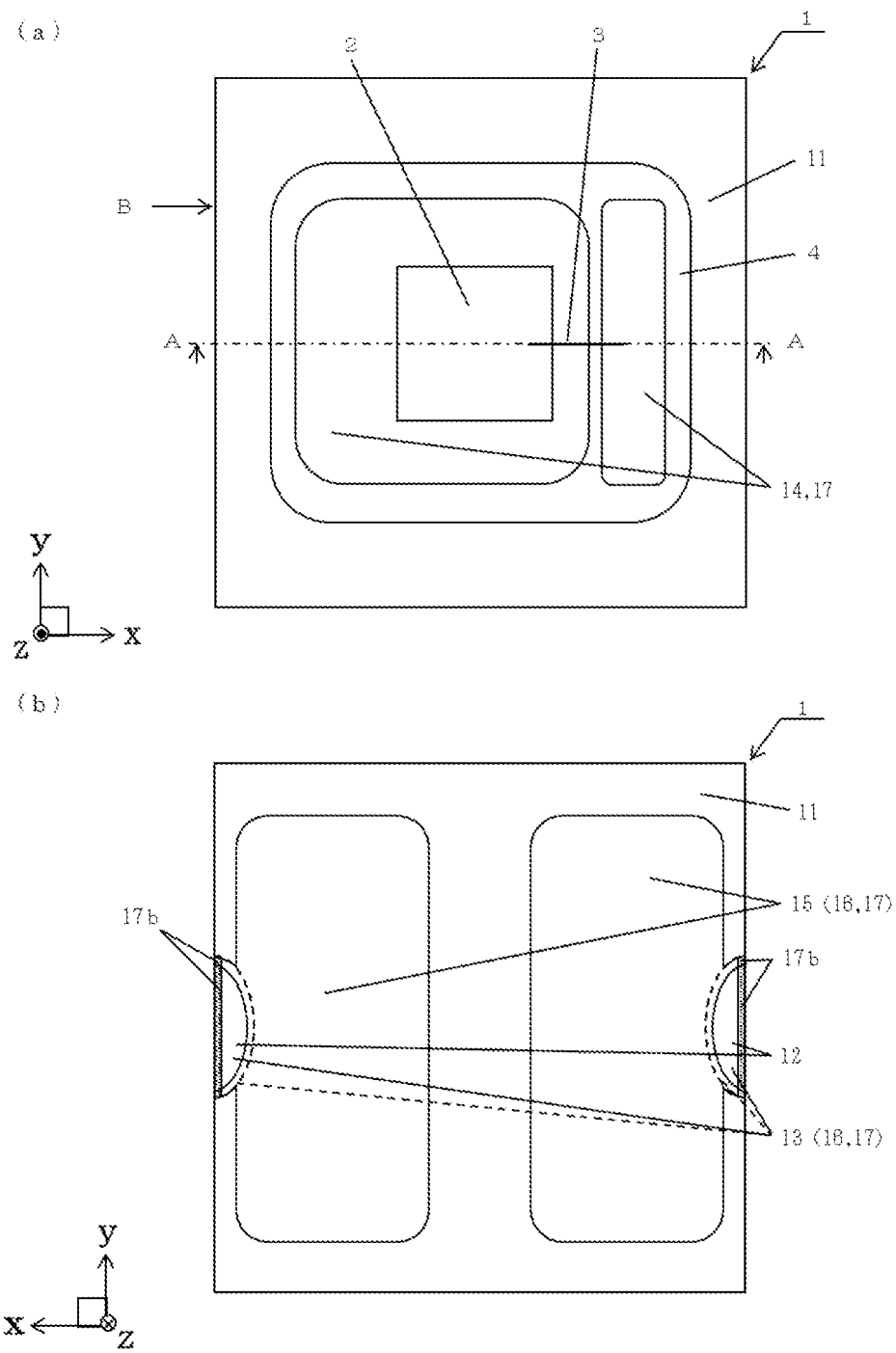
FIG. 1A is a top view of an electronic device according to a first embodiment of the present invention.
FIG. 1B is a bottom view of FIG. 1A.
Figure 2:
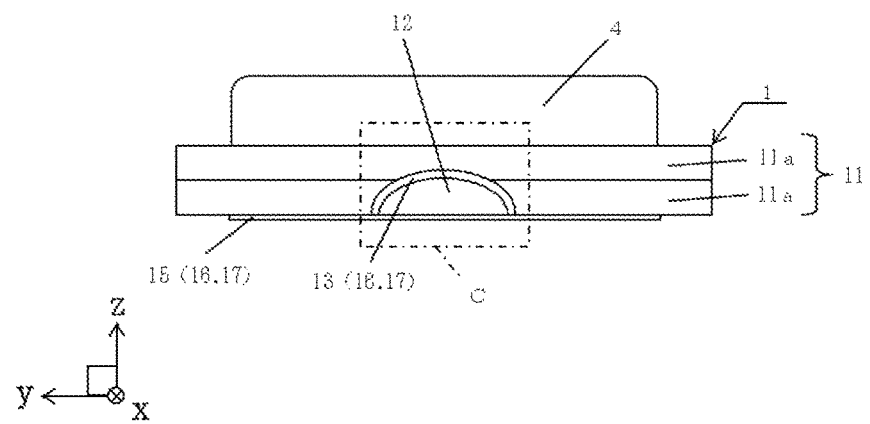
FIG. 2A is a side view of FIG. 1A in direction B.
FIG. 2B is an enlarged side view of a main part, showing part C in FIG. 2A.
Figure 2:
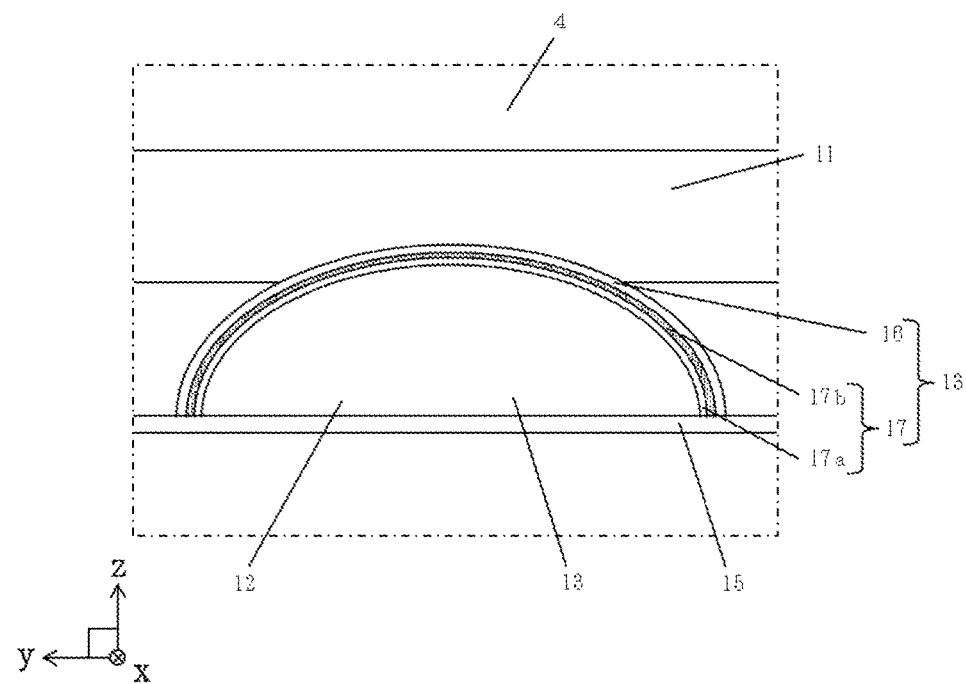
Figure 3:
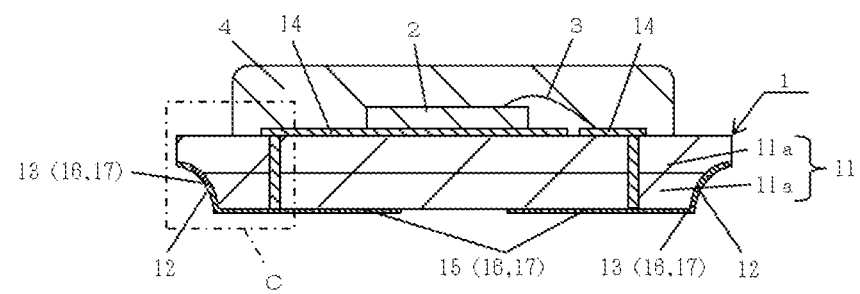
FIG. 3 is a cross-sectional view of the electronic device shown in FIG. 1A taken along line A-A.
Figure 3:
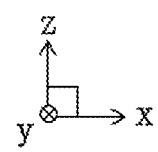
Figure 4:
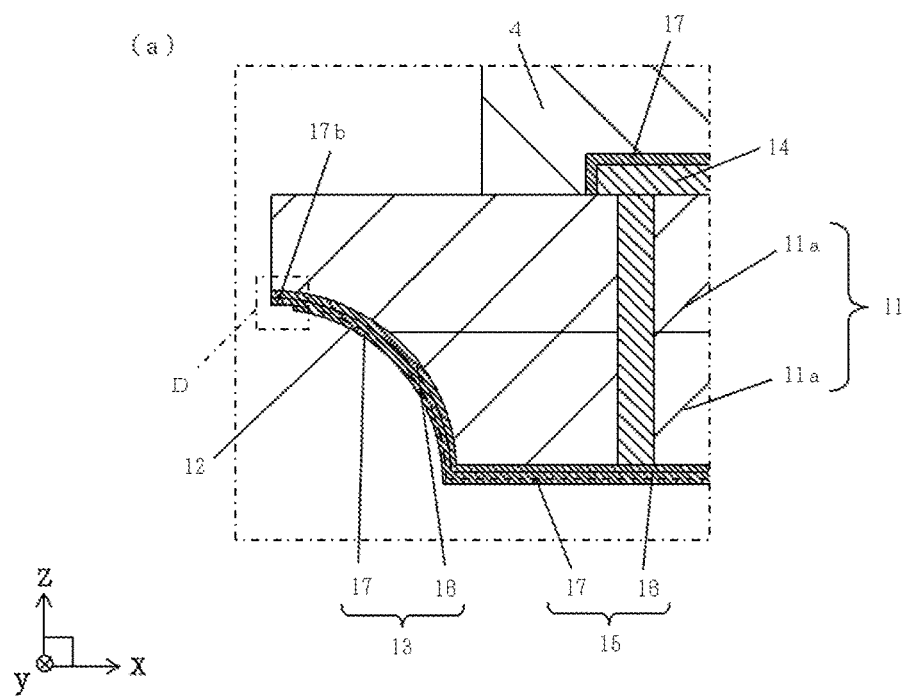
FIG. 4A is an enlarged cross-sectional view of a main part, showing part C in FIG. 3.
FIG. 4B is an enlarged cross-sectional view of a main part, showing part D in FIG. 4A.
Figure 4:
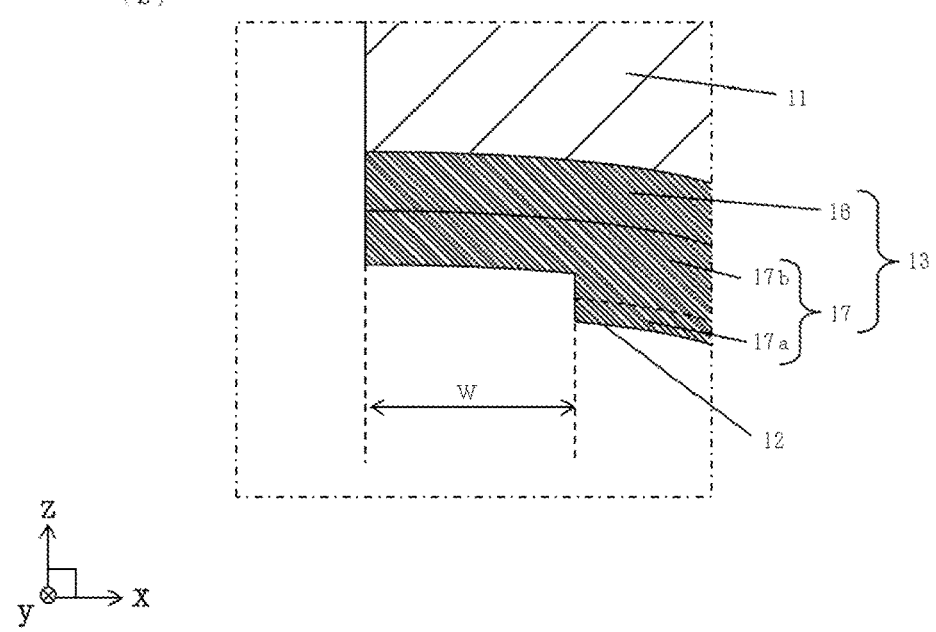

Exemplary embodiments of the present invention will be described with reference to the accompanying drawings.

First Embodiment

An electronic device according to a first embodiment of the present invention includes a wiring board 1 and an electronic component 2 mounted on the upper surface of the wiring board 1 as shown in FIGS. 1A to 4B and FIG. 7. As in the example shown in FIG. 7, the electronic device is joined to a module substrate 5 with solder 6 to form an electronic module.

The wiring board 1 includes an insulating substrate 11 having cutouts 12 opened in its main surface and side surfaces, and inner electrodes 13 each including multiple metal layers formed on the inner surfaces of the cutouts 12. Each inner electrode 13 includes, as an intermediate layer, at least one metal layer 17b selected from the group consisting of a nickel layer, a chromium layer, a platinum layer, and a titanium layer, and includes a gold layer as an outermost layer 17a. The metal layer 17b is exposed at an outer edge portion of the corresponding inner electrode. In FIGS. 1A to 4B and FIG. 7, the electronic device is mounted along an x-y plane in a virtual xyz space. In FIGS. 1A to 4B and FIG. 7, the upward direction refers to a positive direction of a virtual z-axis. The upward and downward directions herein are for descriptive purposes only and do not define the directions in actual use of the wiring board 1 or other parts.

The insulating substrate 11, which includes either a single insulator layer 11a or a plurality of insulator layers 11a, has its upper surface defining a mounting area for the electronic component 2. The insulating substrate 11 is a rectangular plate when viewed from above, or viewed from above in a direction perpendicular to its upper surface. The insulating substrate 11 functions as a support for the electronic component 2. The insulating substrate 11 has the central mounting area on its upper surface, to which the electronic component 2 is adhered and fixed with a bonding member, such as a low-melting point brazing filler metal or a conductive resin.

The insulating substrate 11 may be, for example, a ceramic such as sintered aluminum oxide (alumina ceramic), sintered aluminum nitride, sintered mullite, or sintered glass ceramic.

For the insulating substrate 11 formed from, for example, sintered aluminum oxide, the powders of raw materials such as aluminum oxide, silicon oxide, magnesium oxide, and calcium oxide are mixed with an appropriate organic binder and a solvent to form slurry. The slurry is then shaped into a sheet using a doctor blade or by calendering to obtain a ceramic green sheet. The ceramic green sheet then undergoes punching. Where necessary, multiple ceramic green sheets prepared in this manner are laminated on one another as appropriate. The laminated sheets are then fired at high temperature (about 1600° C.) to complete the insulating substrate 11. The cutouts 12 open in the main surface and the side surfaces of the insulating substrate 11. In the examples shown in FIGS. 1A to 4B and FIG. 7, each cutout 12 opens across two surfaces, namely a lower main surface (lower surface) and one side surface of the insulating substrate 11. Each cutout 12 may open across three surfaces, namely an upper main surface (upper surface), the lower main surface (lower surface), and the side surface of the insulating substrate 11. In the examples shown in FIGS. 1A to 3, each cutout 12 is semielliptical as viewed from above, and has the shape of a partial ellipsoid and thus has a curved inner surface. Each cutout 12 may have the shape of a partial hemisphere, which is a semicircle or a semiellipse, as viewed from above.

These cutouts 12 are each formed by forming a hole to be the cutout 12 in the insulating substrate 11 by, for example, blasting. The inner surface of each cutout 12 is curved. Each cutout 12 may have the shape of a partial column or a partial square frustum that is a rectangle with rounded corners as viewed from above. The cutout 12 may also be semicircular, half elliptical, or semielliptical as viewed from above. The cutout 12 may also have the shape of a partial column or a partial frustum combining a plurality of cutouts 12 with different size profiles. These cutouts 12 are prepared by forming through-holes to be the cutouts 12 through some of the ceramic green sheets for the insulating substrate 11 by laser processing or by punching using a die.

The inner electrode 13 is formed on the inner surface of each cutout 12, and wiring conductors 14 are formed inside and on the surface of the insulating substrate 11. In the examples shown in FIGS. 1A to 3, the inner electrode 13 extends across the entire inner surface of the cutout 12. As in the examples shown in FIGS. 1A to 3, the main surface opening the cutouts 12 further has main surface electrodes 15, which are connected to the inner electrodes 13. These inner electrodes 13 and the main surface electrodes 15 form external electrodes. The wiring conductors 14 and the main surface electrodes 15 are connected at the lower surface of the insulating substrate 11. The inner electrodes 13 and the wiring conductors 14 are electrically connected through the main surface electrodes 15.

The external electrodes including the inner electrodes 13 and the main surface electrodes 15 are used to join the wiring board 1 to the module substrate 5. The inner electrodes 13, the wiring conductors 14, and the main surface electrodes 15 electrically connect the module substrate 5 to the electronic component 2 that is mounted on the wiring board 1. The wiring conductors 14 include wiring conductors arranged inside or on the surface of the insulating substrate 11, and feedthrough conductors extending through the insulator layers 11a of the insulating substrate 11 to electrically connect the upper and lower wiring conductors.

The inner electrodes 13 or the main surface electrodes 15 each include multiple metal layers, namely, a thin-film layer 16 and a plating layer 17. The thin-film layer 16 includes, for example, an adhesive metal layer and a barrier layer. The adhesive metal layer in the thin-film layer 16 extends on the main surface of the insulating substrate 11 and the inner surface of each cutout 12. The adhesive metal layer contains, for example, tantalum nitride, nickel-chromium, nickelchromium-silicon, tungsten-silicon, molybdenum-silicon, tungsten, molybdenum, titanium, or chromium. The adhesive metal layer is deposited on the surface of the insulating substrate 11 and the inner surface of each cutout 12 with a thin film deposition technique such as vapor deposition, ion plating, or sputtering. To form the adhesive metal layer by, for example, vacuum deposition, the insulating substrate 11 is first placed in a film deposition chamber of a vacuum evaporator, and a metal piece, which is to be the adhesive metal layer, is placed on a vapor deposition source in the film deposition chamber. The film deposition chamber is evacuated to create a vacuum (with a pressure of $10^{-2}$ Pa or less), and the metal piece placed on the vapor deposition source is vaporized by heating. The molecules of the vaporized metal piece are then deposited onto the insulating substrate 11 to form a thin film metal layer, which is to be the adhesive metal layer. A resist pattern is subsequently formed on the insulating substrate 11 with the thin film metal layer by photolithography, and the remaining part of the thin film metal layer is removed by etching. This completes the adhesive metal layer. The barrier layer is deposited on the upper surface of the adhesive metal layer. The barrier layer, which has a high joining property and wettability with the adhesive metal layer and the plating layer, allows the adhesive metal layer and the plating layer to be firmly joined together and prevents mutual diffusion between the adhesive metal layer and the plating layer. The barrier layer contains, for example, nickel-chromium, platinum, palladium, nickel, or cobalt. The barrier layer is deposited on the surface of the adhesive metal layer with a thin film deposition technique such as vapor deposition, ion plating, or sputtering.

The adhesive metal layer may have a thickness of about 0.01 to 0.5 μm. An adhesive metal layer with a thickness less than 0.01 μm may not be firmly adhered to the insulating substrate 11. An adhesive metal layer with a thickness more than 0.5 μm may easily come off because of its internal stress generated during formation. The barrier layer may have a thickness of about 0.05 to 1 μm. A barrier layer with a thickness less than 0.05 μm may have a defect such as a pinhole, and may degrade its function as a barrier layer. A barrier layer with a thickness more than 1 μm may easily come off because of its internal stress generated during formation.

The plating layer 17 is deposited on the surface of the thin-film layer 16 by electroplating or electroless plating. The plating layer 17 is formed from metals with high corrosion resistance and connectivity with a connection member, such as nickel, copper, gold, or silver. For example, a nickel plating layer with a thickness of about 0.5 to 5 μm and a gold plating layer with a thickness of about 0.1 to 3 μm are deposited on the surface one after the other. This effectively prevents corrosion of the inner electrode 13 and the main surface electrode 15, and strengthens the joining of the inner electrode 13 and the main surface electrode 15 to a connection pad 51 formed on the module substrate 5.

An additional layer of metal, such as copper (Cu) or gold (Au), may be placed on the barrier layer to allow intended formation of the plating layer 17. This metal layer is formed in the same manner as the thin-film layer 16.

The wiring conductors 14 may be formed from metal materials such as tungsten (W), molybdenum (Mo), manganese (Mn), silver (Ag), or copper (Cu). For an insulating substrate 11 formed from sintered aluminum oxide, for example, a conductor paste containing powdery refractory metal, such as W, Mo, or Mn, mixed with an appropriate organic binder and a solvent is preliminarily applied in a predetermined pattern by screen printing on a ceramic green sheet, which is to be the insulating substrate 11. The metal, together with the ceramic green sheet to be the insulating substrate 11, is fired to form the wiring conductors 14 applied at predetermined positions on the insulating substrate 11. To form feedthrough conductors as the wiring conductors 14, through-holes are formed in the green sheet by punching using a die or a punch or by laser processing. The through-holes are then filled with conductor paste for the wiring conductors 14 by printing.

The wiring conductors 14 each have an exposed surface on which a plating layer 17 is deposited by electroplating or electroless plating in the same manner as performed on the thin-film layer 16 of the inner electrode 13 and the thin-film layer 16 of the main surface electrode 15. The plating layer 17 is formed from metals with high corrosion resistance and connectivity with a connection member, such as nickel, copper, gold, or silver. For example, a nickel plating layer with a thickness of about 0.5 to 5 μm and a gold plating layer with a thickness of about 0.1 to 3 μm, or a nickel plating layer with a thickness of about 1 to 10 μm and a silver plating layer with a thickness of about 0.1 to 1 μm are deposited on the surface one after the other. This effectively prevents corrosion of the wiring conductor 14, and strengthens the adhesion between the wiring conductor 14 and the electronic component 2 and the joining of the wiring conductor 14 to a connection member 3 such as a bonding wire.

Each inner electrode 13 includes, as an intermediate layer, at least one metal layer 17b selected from the group consisting of a nickel layer, a chromium layer, a platinum layer, and a titanium layer, and includes a gold layer as an outermost layer. The metal layer 17b is exposed at an outer edge portion of the inner electrode 13. The outer edge portion of the inner electrode 13 refers to its outer edge portion adjacent to one side surface of the insulating substrate 11. In the examples shown in FIGS. 1A to 4B, the metal layer 17b is exposed to a strip-like step part at the outer edge portion of the inner electrode 13 adjacent to the side surface of the insulating substrate 11 and along the opening of the cutout 12 at the side surface of the insulating substrate 11. The metal layer 17b is shaded in FIGS. 1B and 2B. When the exposed part of the metal layer 17b at the outer edge portion of the inner electrode 13 has a width W in a range of about 0.01 to 0.2 mm inclusive as viewed from above, the wiring board 1 can be small and have high circuit density and have highly reliable electrical connection to the module substrate 5 over a long period of time. The wettability of the solder 6 on the outermost layer 17a (metal layer), which is a gold layer, and on the metal layer 17b selected from the group consisting of a nickel layer, a chromium layer, a platinum layer, and a titanium layer can be determined by applying a small amount of solder 6 to the outermost layer 17a, which is a gold layer, and to the metal layer 17b selected from the group consisting of a nickel layer, a chromium layer, a platinum layer, and a titanium layer, and determining the difference in the spreading of the solder 6 after a reflow process performed at about 200° C. In this case, the surface roughness Ra1 of the outermost layer 17a and the surface roughness Ra2 of the metal layer 17b may be equivalent to each other, or one roughness may at least fall within ±30% of the other roughness.

The metal layer 17b, which is formed from a metal with low wetting of the solder 6, such as nickel (Ni), chromium (Cr), platinum (Pt), or titanium (Ti), is completed by removing a strip part of the outermost layer 17a, which is formed from a metal with high wetting of the solder 6, such as gold (Au), at the outer edge portion of the inner electrode 13 adjacent to the side surface of the insulating substrate 11. For example, the intermediate metal layer 17b may be exposed by applying a laser beam to the outer edge portion of the inner electrode 13 including the thin-film layer 16 and the plating layer 17 adjacent to the side surface of the insulating substrate 11 and thus removing a strip part from the outermost layer 17a. For example, when the plating layer 17 of the inner electrode 13 includes two layers, namely an Ni plating layer and an Au plating layer, the Ni plating layer, which is the intermediate metal layer 17b, is exposed by applying a laser beam to the outer edge portion of the inner electrode 13 adjacent to the side surface of the insulating substrate 11 and thus removing a strip part from the Au plating layer, which is the outermost layer 17a. In other words, the Ni layer, which has lower wetting of the solder 6 than the Au layer, is exposed on the surface to form the metal layer 17b at the outer edge portion of the inner electrode 13 and also to allow the inner surface of the inner electrode 13 and the main surface electrode 15 to have higher wetting of the solder 6.

As in the example shown in FIGS. 4A and 4B, a part of the metal layer 17b may also be removed in the thickness direction together with a part of the outermost layer 17a at the outer edge portion of the inner electrode 13 adjacent to the side surface of the insulating substrate 11. In this case, the part of the outermost layer 17a is removed at the outer edge portion of the inner electrode 13 to expose the metal layer 17b in a more reliable manner.

The plating layer 17 may not include the Ni/Au plating layers, but may be, for example, any other plating layer including Cu/Ni/Au plating layers or Ni/Pd/Au plating layers. When the plating layer includes three or more layers, strip parts may be removed from a plurality of metal layers near the surface including the outermost layer 17a at the outer edge portion of the inner electrode 13 to expose the intermediate metal layer 17b.

The solder 6 is formed from an alloy such as tin-copper (Sn—Cu), tin-silver-copper (Sn—Ag—Cu), or gold-tin (Au—Sn). For example, the solder 6 may be any alloy having high wettability on the outermost layer 17a, which is formed from a metal such as gold (Au), including nickel (Ni), chromium (Cr), platinum (Pt), and titanium (Ti), and having lower wettability on the metal layer 17b (lower wetting of the solder 6) than the outermost layer 17a. Such solder 6 connects the electronic device to the module substrate 5.

In this manner, a laser beam is applied to parts of the wiring board 1 to prevent heat from transferring to the inner electrodes 13, the wiring conductors 14, and the main surface electrodes 15, and to prevent the conductors from being altered by such heat transfer. The resultant wiring board 1 can strengthen the adhesion between the wiring conductors 14 and the electronic component 2, the joining between the wiring conductors 14 and the connection member 3 such as a bonding wire, and the connection of the inner electrodes 13 and the main surface electrodes 15 to the connection pads 51 on the module substrate 5.

Although the metal layer 17b exposed at the outer edge portion of the inner electrode 13 may be spaced from the opening of the cutout 12 adjacent to the side surface of the insulating substrate 11, the metal layer 17b that extends along the opening of the cutout 12 allows the outer edge portion of the inner electrode 13 to have no part with high wetting of the solder 6 and thus allows the inner electrode 13 to have a large inner space. The resultant wiring board 1 can have the inner electrodes 13 and the main surface electrodes 15 firmly joined to the connection pads 51 on the module substrate 5.

The wiring board 1 includes the insulating substrate 11 having the cutouts 12 opened each in two surfaces, namely the main surface and the side surface, and the inner electrode 13 including multiple metal layers formed on the inner surface of each cutout 12. Each inner electrode 13 includes, as the intermediate layer, at least one metal layer 17b selected from the group consisting of a nickel layer, a chromium layer, a platinum layer, and a titanium layer, and includes a gold layer as the outermost layer 17a. The metal layer 17b is exposed at the outer edge portion of the inner electrode 13. This structure prevents the solder 6 from being applied onto the outer edge portion of the inner electrode 13. This prevents the solder 6 from transferring stress caused by the difference in thermal expansion between the wiring board 1 and the module substrate 5 to the outer edge portion of the inner electrode 13, and reduces the possibility of the inner electrode 13 coming off the insulating substrate 11. The resultant wiring board 1 can be small and have high circuit density and have highly reliable electrical connection to the module substrate 5 over a long period of time.

Figure 5:
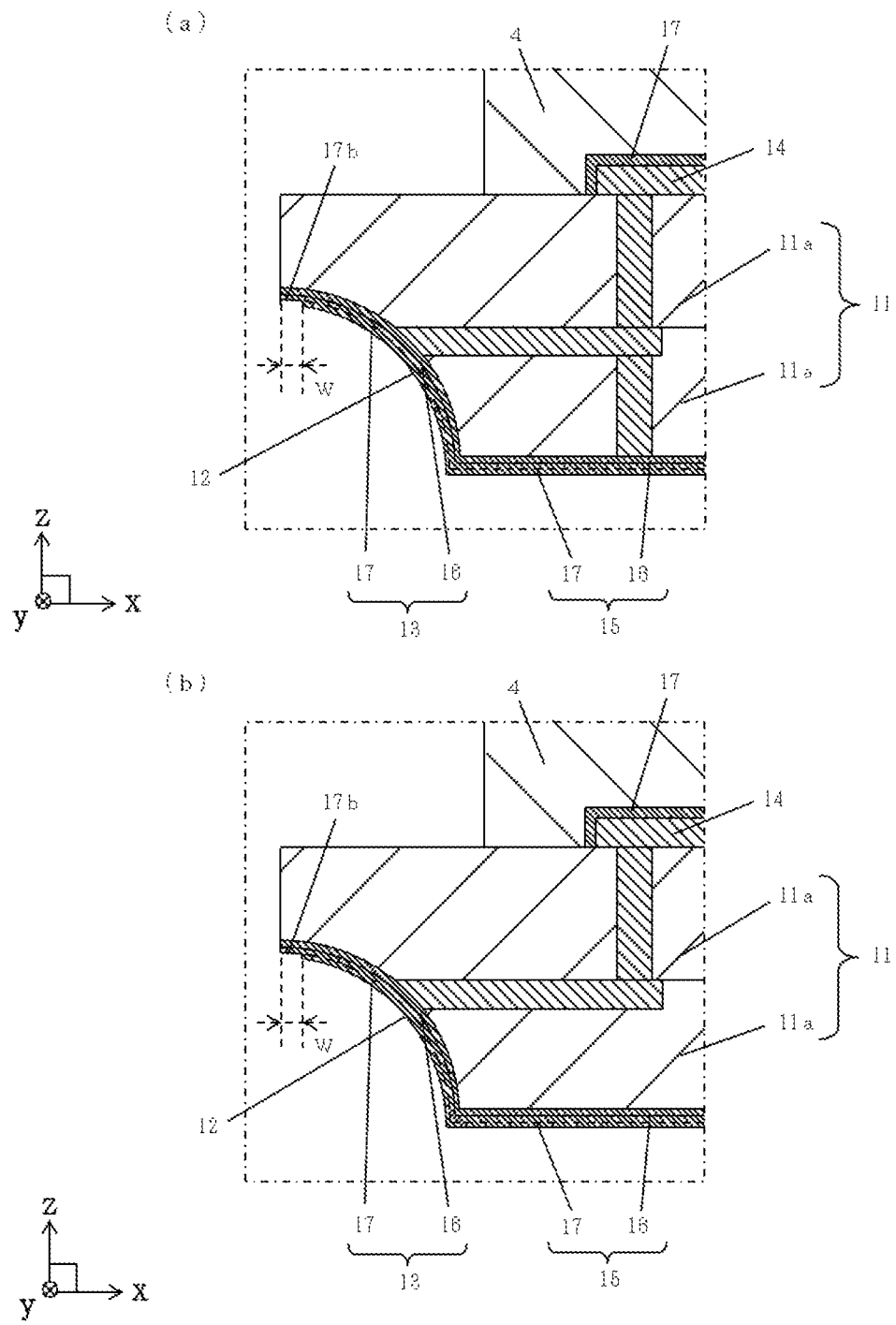
FIGS. 5A and 5B are enlarged cross-sectional views of main parts in other examples of the electronic device according to the first embodiment of the present invention.

In the examples shown in FIGS. 1A to 4B, the wiring conductors 14 and the main surface electrodes 15 are connected to each other at the main surface (lower surface) of the insulating substrate 11. In the example shown in FIG. 5B, the wiring conductor 14 is connected to the inner electrode 13 at the inner surface of the cutout 12 opposite to the main surface (lower surface) of the insulating substrate 11, and the wiring conductor 14 and the main surface electrode 15 are connected to each other with the inner electrode 13. In the example shown in FIG. 5A, the inner electrode 13 and the wiring conductor 14 are connected to each other at the inner surface of the cutout 12, and the wiring conductor 14 and the main surface electrode 15 are connected to each other with the inner electrode 13 extending from the inner surface of the cutout 12 directly at the main surface (lower surface) of the insulating substrate 11. The wiring conductor 14 connected to the main surface electrode 15 allows the main surface electrode 15 to firmly adhere to the main surface of the insulating substrate 11. This improves the electrical connection between the module substrate 5 and the wiring board 1 on which the electronic component 2 is mounted, in comparison with the structure including the inner electrode 13 connected to the wiring conductor 14 at the inner surface of each cutout 12.

The wiring board 1 according to the first embodiment of the present invention may be manufactured with the method described below.

Figure 6:
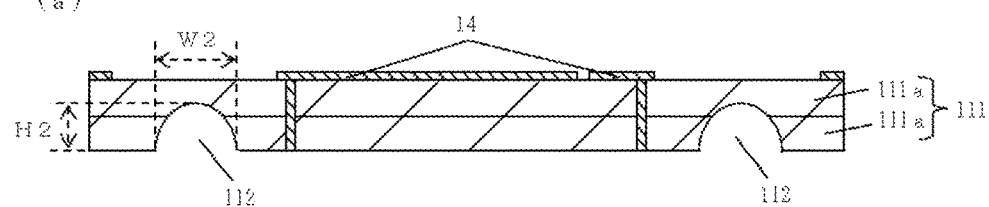
FIGS. 6A to 6D are cross-sectional views describing a method of manufacturing the wiring board according to the first embodiment of the present invention.
Figure 6:
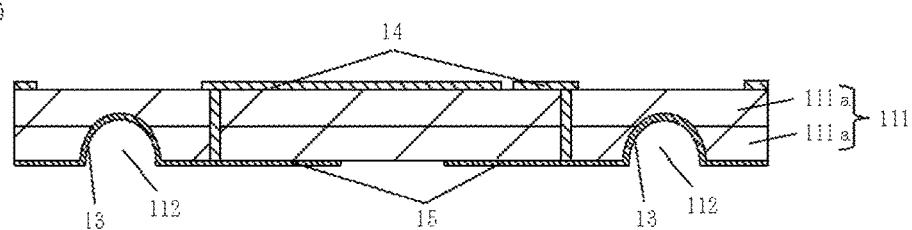
Figure 6:
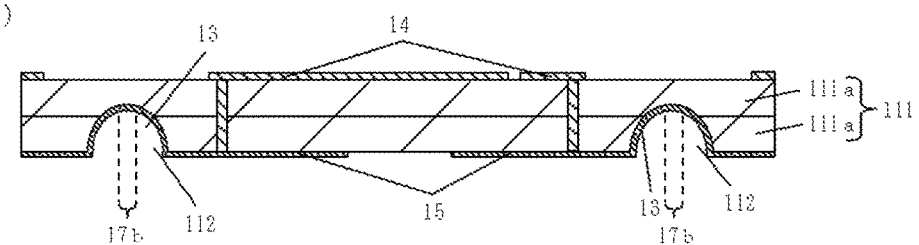
Figure 6:
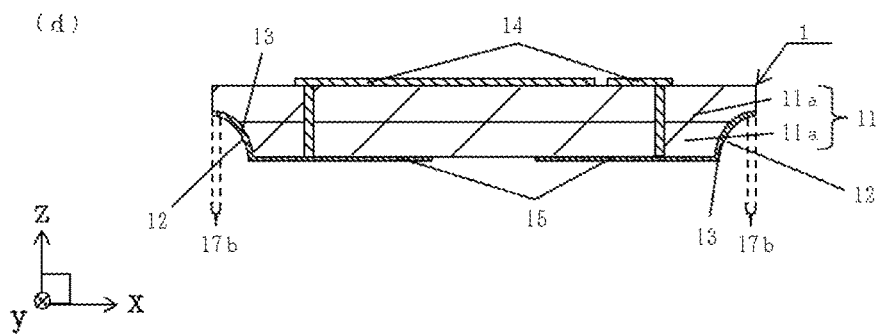

As in the example shown in FIG. 6A, an insulating mother substrate 111 is prepared to include multiple insulator layers 111a having wiring conductors 14 placed inside as well as on its surface. The insulating mother substrate 111 includes multiple insulating substrates 11 arranged integrally, which are to be cut into individual pieces. The insulating mother substrate 111 has hemispherical recesses 112, which are to be cutouts 12, opened in the lower main surface. As described above, these recesses 112 are formed by, for example, blasting. As in the example shown in FIG. 6B, the inner electrode 13 including the thin-film layer 16 and the plating layer 17 is formed on the inner surface of each recess 112, which is to be the cutout 12 in the insulating mother substrate 111. The main surface electrode 15 including the thin-film layer 16 and the plating layer 17 is formed on the surface of the insulating mother substrate 111. As in the example shown in FIG. 6C, a laser beam is applied to a predetermined area of the inner electrode 13 on the inner surface of each recess 112 to remove a strip part from the outermost layer 17a along the part to be the outer edge of the wiring board 1. The metal layer 17b, which is an intermediate layer, is exposed in the area from which the strip part has been removed. As in the example shown in FIG. 6D, the recesses 112 are then cut by slicing or another technique to complete the wiring board 1 having the inner electrodes 13 each having the metal layer 17b is exposed at the outer edge portion of the inner electrode.

As in the example shown in FIG. 6A, each recess 112 has a width W2 that is equal to or greater than the depth H2 of the recess 112 (W2≥H2). This allows easier formation of the inner electrode 13 on the inner surface of the recess 112 as well as the metal layer 17b exposed at the outer edge portion.

The metal layer 17b formed on the inner surface of the recess 112 and exposed by removing a part of the outermost layer 17a may be wider than the width of a blade for cutting the recess 112 by slicing. More specifically, the part of the metal layer 17b to be exposed may have a width that is 110% or more of the blade width. This allows fabrication of the wiring board 1 including the inner electrodes 13 each having the metal layer 17b exposed like a strip at the outer edge portion of the inner electrode 13 along the opening edge.

Multiple rows of metal layers 17b may be exposed like strips at the inner electrode 13 formed on the inner surface of each recess 112. The recesses 112 may then be cut to complete the wiring board 1 including the inner electrodes 13 each having the metal layers 17b exposed at the outer edge portion of the inner electrode 13.

The above manufacturing method yields the wiring board 1 having good electrical connection to the electronic component 2 and to the module substrate 5 with high productivity.

The metal layer 17b exposed at the outer edge portion of each inner electrode 13 prevents the solder from spreading to the exposed end of the thin-film layer 16 of the inner electrode 13 when the recesses 112 are cut and the thin-film layer 16 and the plating layer 17 of the inner electrode 13 are exposed at the side surface of the insulating substrate 11 as in the examples shown in FIGS. 1A to 4B.

In the structure including the inner electrode 13 connected to the wiring conductor 14 at the inner surface of the cutout 12 as in the examples shown in FIGS. 5A and 5B, the wiring conductor 14 may be formed to overlap the recess 112 in the insulating mother substrate 111 as viewed from above, and is exposed in the recess 112 by blasting or another technique. The inner electrode 13 may then be formed on the inner surface of the recess 112 and connected to the wiring conductor 14.

After the recess 112 is cut, a part of the outermost layer 17a may be removed by applying a laser beam to the outer edge portion of the inner electrode 13 formed on the inner surface of each cutout 12 to expose the intermediate metal layer 17b. In this case, a laser beam may be applied to the outer edge portion of the inner electrode 13 in a direction lateral to the insulating substrate 11 after the cutting. When the cutout 12 (recess 112) is either small or deep, the inner electrode 13 having the metal layer 17b exposed at the outer edge portion of the inner electrode 13 is easily formed with high accuracy. The resultant wiring board 1 can have good electrical connection to a smaller electronic component 2 and to the module substrate 5.

The electronic component 2 can be mounted on the upper surface of the wiring board 1 to obtain the electronic device. The electronic component 2 mounted on the wiring board 1 is, for example, a semiconductor device such as an integrated circuit (IC) chip or a large-scale integrated circuit (LSI) chip, a light-emitting device, a quartz oscillator, a piezoelectric element such as a piezoelectric vibrator, or one of various sensors. When, for example, the electronic component 2 is a semiconductor device to be connected by wire bonding, the semiconductor device is fixed to the wiring conductor 14 using a bonding member such as low-melting point brazing filler metal or a conductive resin, and then mounted on the wiring board 1 by electrically connecting the electrode of the semiconductor device and the wiring conductor 14 with the connection member 3, such as a bonding wire. When, for example, the electronic component 2 is a semiconductor device to be connected by flip-chip, the semiconductor device is mounted on the wiring board 1 by electrically and mechanically connecting the electrode of the semiconductor device and the wiring conductor 14 with the connection member 3, such as solder bumps, gold bumps, or a conductive resin (e.g., anisotropic conductive resin). The wiring board 1 can have a plurality of electronic components 2 or a small electronic component such as a resistance element or a capacitive element mounted as appropriate. The electronic component 2 is sealed with a sealant 4, such as resin or glass, or may be sealed with a lid made of resin, glass, ceramic, or metal as appropriate.

Figure 7:
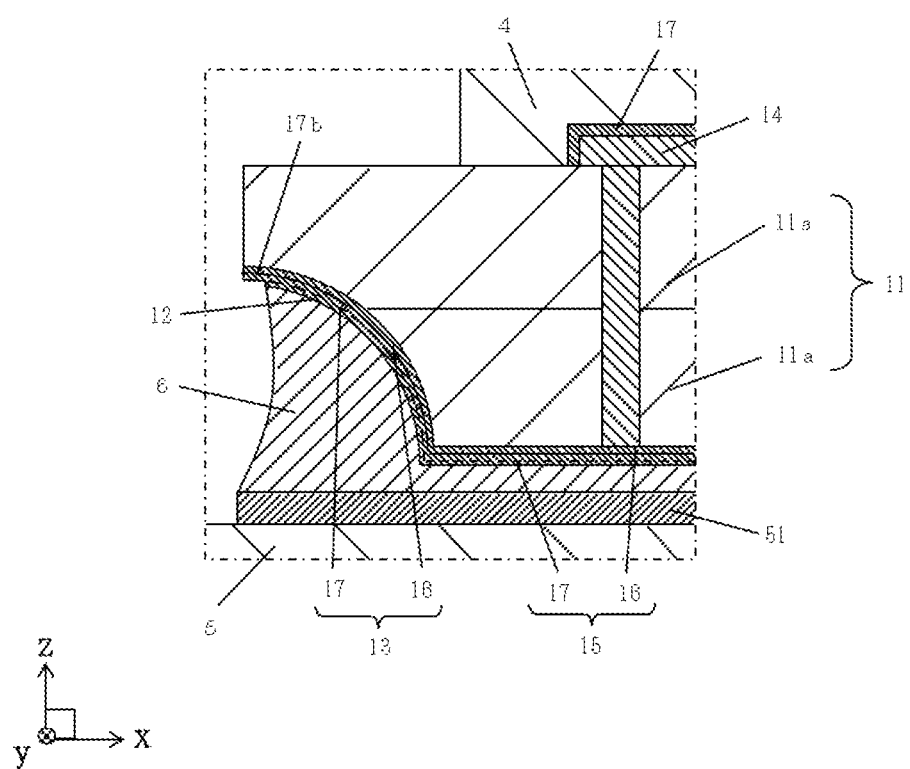
FIG. 7 is an enlarged cross-sectional view showing a main part of an electronic module including the electronic device in FIGS. 1A and 1B mounted on a module substrate.
Figure 8:
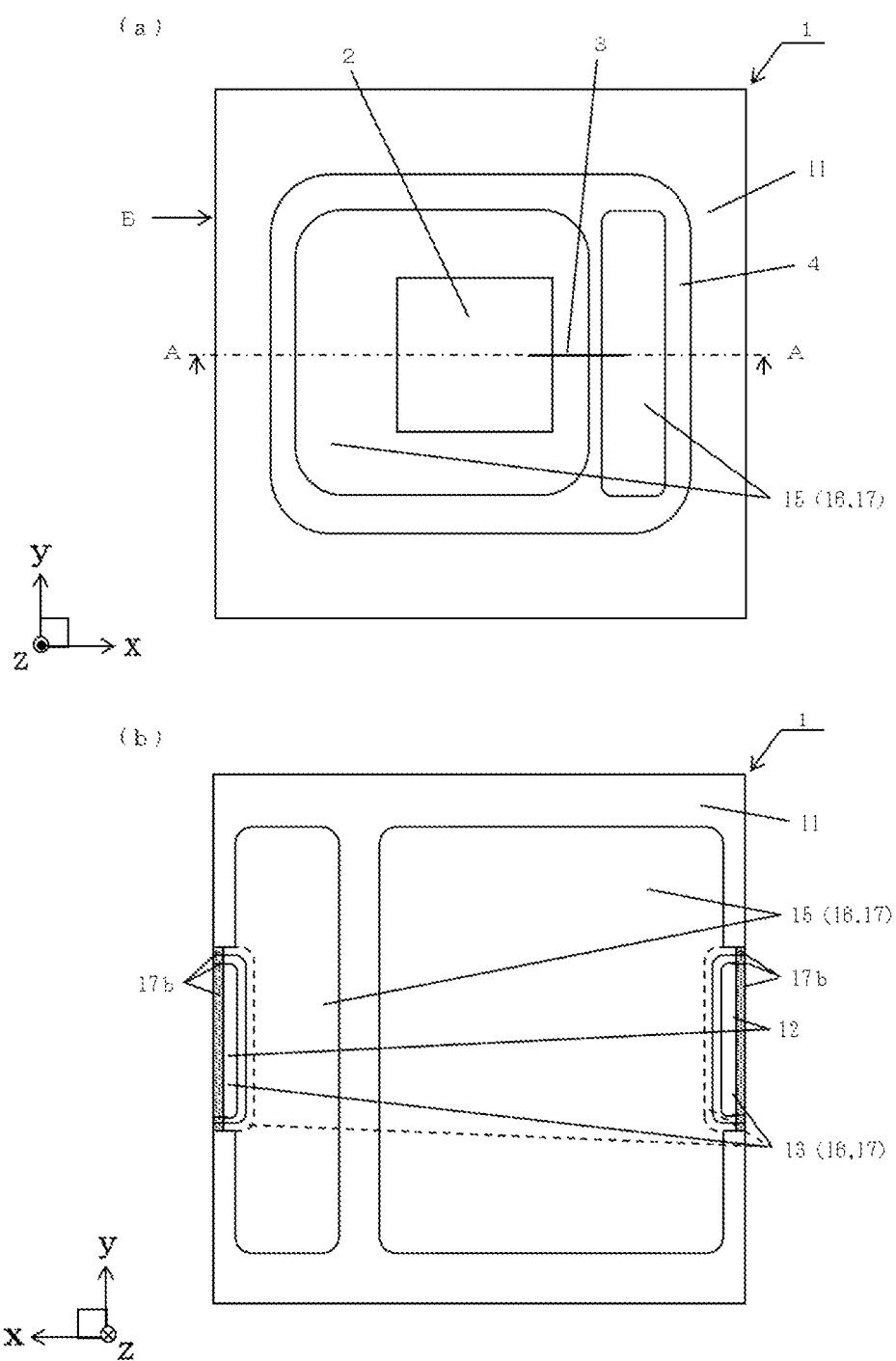
FIG. 8A is a top view of an electronic device according to a second embodiment of the present invention.
FIG. 8B is a bottom view of FIG. 8A.
Figure 9:
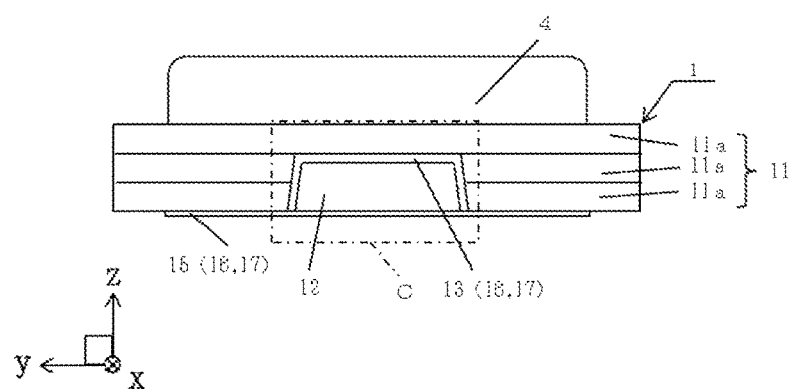
FIG. 9A is a side view of FIG. 8A in direction B.
FIG. 9B is an enlarged side view of a main part, showing part C in FIG. 9A.
Figure 9:
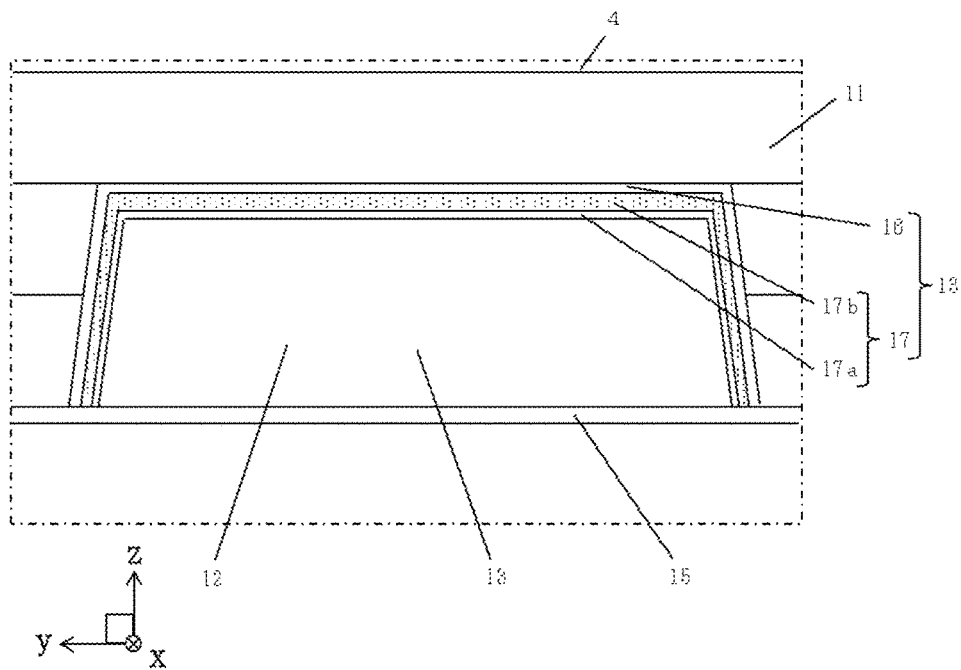
Figure 10:
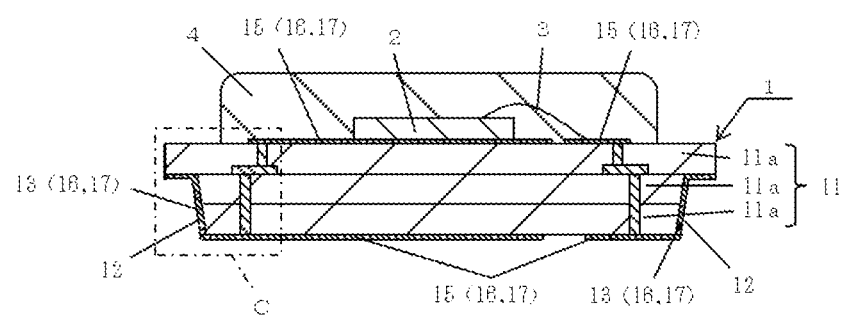
FIG. 10A is a cross-sectional view of the electronic device shown in FIG. 8A taken along line A-A.
FIG. 10B is an enlarged cross-sectional view of a main part, showing part C in FIG. 10A.
Figure 10:
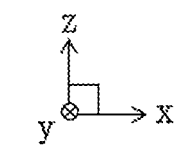
Figure 10:
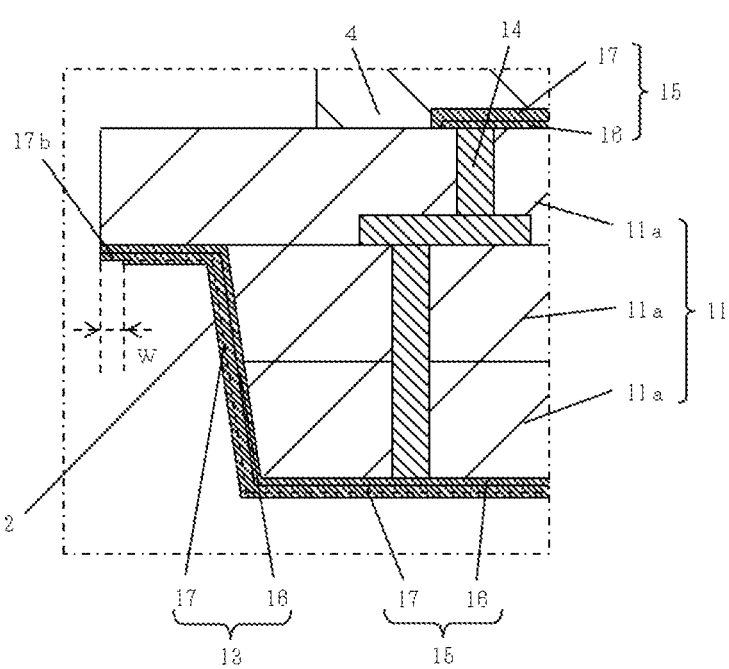
Figure 10:
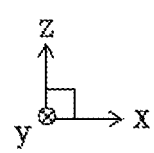
Figure 11:
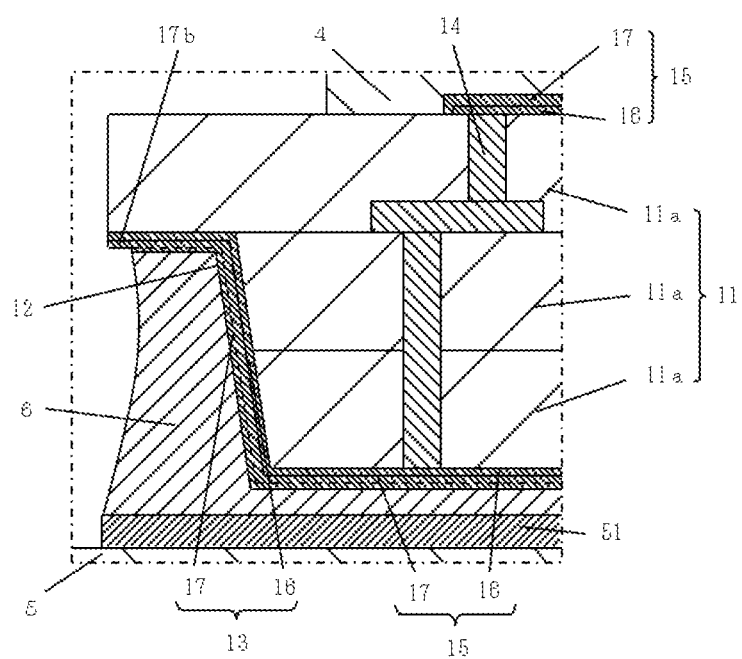
FIG. 11 is an enlarged cross-sectional view showing a main part of an electronic module including the electronic device in FIG. 8 mounted on a module substrate.

As in the example shown in FIG. 7, the electronic device according to the present embodiment is connected to the connection pad 51 on the module substrate 5 with the solder 6 to complete the electronic module. The solder 6 is joined to the inner electrode 13 in the cutout 12 and to the main surface electrode 15 at the lower surface of the insulating substrate 11. The solder 6 slopes and widens from the inner end of the inner electrode 13 excluding the metal layer 17b toward the outer end of the connection pad 51. The metal layer 17b prevents the solder 6 from being applied onto the outer edge portion of the inner electrode 13. This structure prevents the solder 6 from transferring stress caused by the difference in thermal expansion between the wiring board 1 and the module substrate 5 to the outer edge portion of the inner electrode 13, and prevents the inner electrode 13 from coming off the insulating substrate 11. The electronic device is firmly connected to the module substrate 5, and thus the resultant electronic module has higher connection reliability.

The wiring board 1 according to the present embodiment includes the insulating substrate 11 having the cutout opened 12 in the main surface and the side surface, and the inner electrode 13 including multiple metal layers formed on the inner surface of the cutout 12. The inner electrode 13 includes, as the intermediate layer, at least one metal layer 17b selected from the group consisting of a nickel layer, a chromium layer, a platinum layer, and a titanium layer, and a gold layer as the outermost layer 17a, and the metal layer 17b is exposed at an outer edge portion of the inner electrode. This structure prevents the solder 6 from being applied onto the outer edge portion of the inner electrode 13. This prevents the solder 6 from transferring stress caused by the difference in thermal expansion between the wiring board 1 and the module substrate 5 to the outer edge portion of the inner electrode 13, and reduces the possibility of the inner electrode 13 coming off the insulating substrate 11. The resultant wiring board 1 can be small and have high circuit density and have highly reliable electrical connection to the module substrate 5 over a long period of time.

The wiring board 1 according to the present embodiment may be used in a small-size and high-power electronic device, and improves the electrical connection of the wiring board 1. For example, the wiring board 1 may be used as a small mount board for a light-emitting device, on which a high output light-emitting device as the electronic component 2 is mounted.

For the structure including the cutout 12 having a bottom, in comparison with a wiring board 1 according to a second embodiment (described later), an insulating substrate 11 with the cutout 12 may include a single insulator layer 11a. This structure reduces the thickness of the wiring board 1.

The structure with the cutout 12 having a curved inner surface allows easy application of a laser beam to the outer edge portion of an inner electrode 13 formed on the cutout 12. This structure allows intended formation of the inner electrode 13 on the inner surface of the cutout 12 and the metal layer 17b exposed at the outer edge portion of the inner electrode 13. In addition, the solder 6 can easily spread across the entire inner area of the inner electrode 13. The resultant wiring board 1 can be small and have high circuit density and have highly reliable electrical connection to the module substrate 5 over a long period of time.

The electronic device according to the present embodiment includes the wiring board 1 with the above structure, and thus has higher electrical reliability.

The electronic module according to another aspect of the present invention includes the module substrate 5 having the connection pad 51 on the main surface, and the electronic device having the above structure and including the inner electrode 13 connected to the connection pad 51 with the solder 6. This electronic module has highly reliable electrical connection between the wiring board 1 and the module substrate 5 over a long period of time.

Second Embodiment

An electronic device according to a second embodiment of the present invention will now be described with reference to FIGS. 8A to 11.

The electronic device according to the second embodiment of the present invention differs from the electronic device according to the first embodiment in that each cutout 12 is a rectangle with rounded corners as viewed from above, and has a shape extending long along an outer edge of the insulating substrate 11 and corresponding to a portion obtained by dividing a partial square frustum, and a main surface electrode 15 is formed on the upper surface of the insulating substrate 11 as in the examples shown in FIGS. 8A to 11.

The wiring board according to the second embodiment of the present invention prevents solder 6 from being applied onto the outer edge portion of an inner electrode 13 in the same manner as in the first embodiment. This prevents the solder 6 from transferring stress caused by the difference in thermal expansion between the wiring board 1 and a module substrate 5 to the outer edge portion of the inner electrode 13, and reduces the possibility of the inner electrode 13 coming off the insulating substrate 11. The resultant wiring board can be small and have high circuit density and have highly reliable electrical connection to the module substrate 5 over a long period of time.

The main surface electrode 15 formed on the upper surface of the insulating substrate 11 is used as a wiring for mounting an electronic component 2 or for connecting a connection member 3. The main surface electrode 15 formed on the upper surface of the insulating substrate 11 allows the electronic component 2 to be mounted on the wiring board 1 with high accuracy. This allows, for example, accurate mounting of a light-emitting device as the electronic component 2. The resultant light emitter can thus emit light with high accuracy.

The cutout 12 may have the shape corresponding to a portion obtained by dividing a partial column. However, the cutout 12 having the shape corresponding to a portion obtained by dividing a partial square frustum in which an opening width adjacent to the lower surface (main surface) of the insulating substrate 11 is greater than the bottom width of the cutout 12 as in the examples shown in FIGS. 8A to 11 allows intended formation of the inner electrode 13 on the inner surface of the cutout 12 and the metal layer 17b exposed at the outer edge portion of the inner electrode 13.

As described above, the cutout 12 in the wiring board 1 according to the second embodiment is formed by forming a through-hole to be the cutout 12 through some of the ceramic green sheets for the insulating substrate 11 with laser processing or punching using a die.

The inner electrode 13 is formed on the inner-side and bottom faces of the cutout 12 as in the examples shown in FIGS. 8A to 11. The resultant wiring board 1 has high reliability of electrical connection to the module substrate 5.

The wiring board 1 according to the second embodiment may be manufactured in the same manner as in the first embodiment except for the method for forming the cutout 12.

Third Embodiment

An electronic device according to a third embodiment of the present invention will now be described with reference to FIGS. 12A to 13.

Figure 12:
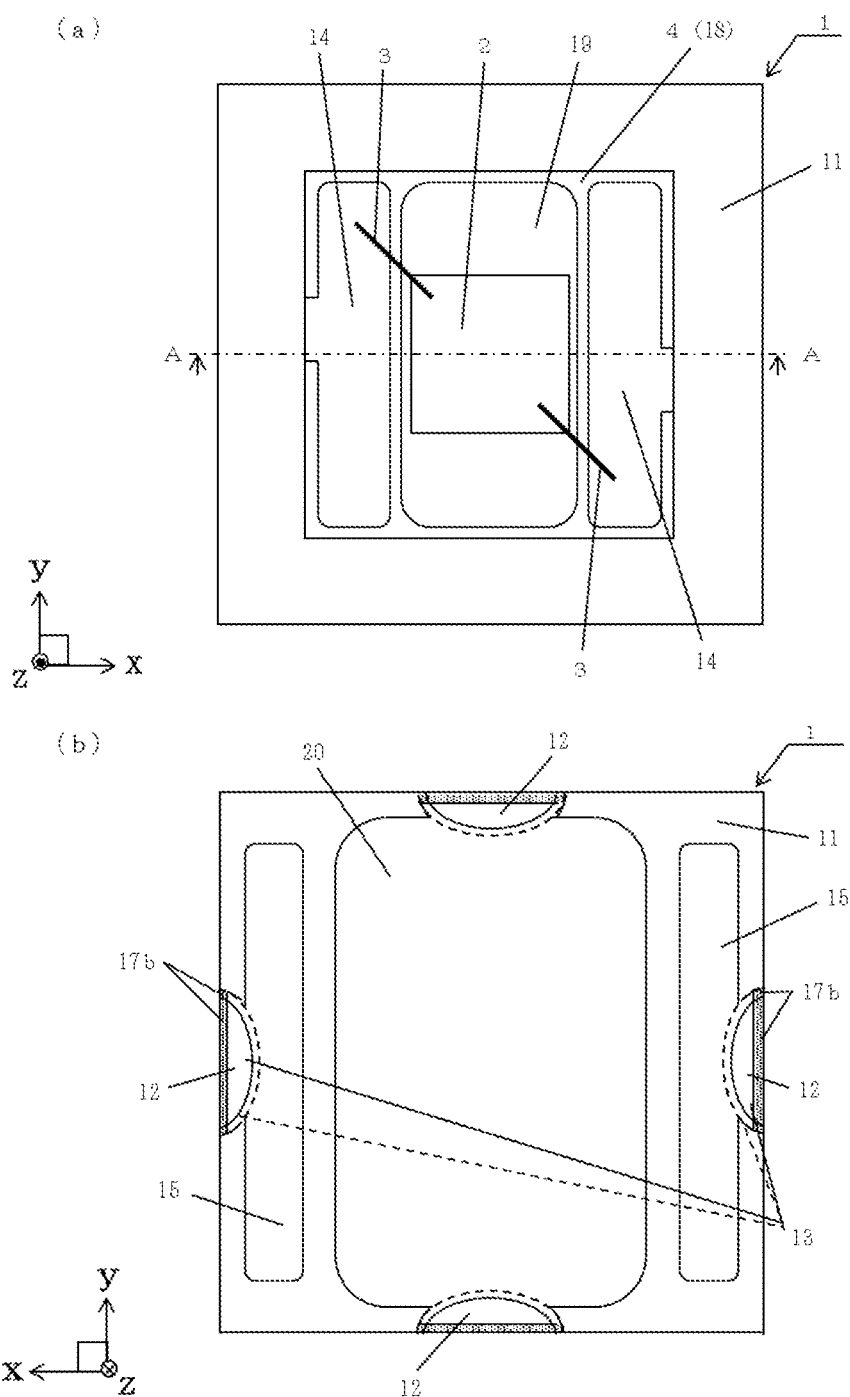
FIG. 12A is a top view of an electronic device according to a third embodiment of the present invention.
FIG. 12B is a bottom view of FIG. 12A.
Figure 13:
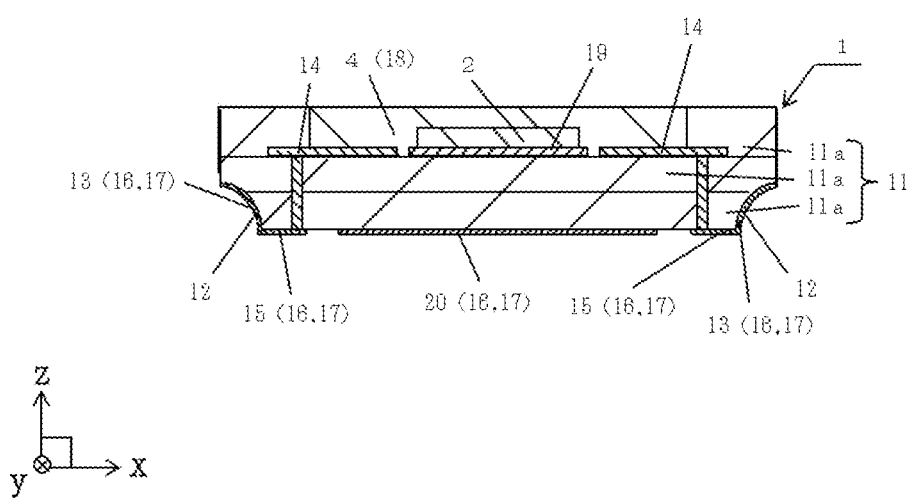
FIG. 13 is a cross-sectional view of the electronic device shown in FIG. 12A taken along line A-A.

The electronic device according to the third embodiment of the present invention differs from the electronic device according to the first embodiment in having a cavity 18 in the upper surface of the insulating substrate 11 as in the examples shown in FIGS. 12A to 13.

The wiring board according to the third embodiment of the present invention prevents solder 6 from being applied onto the outer edge portion of an inner electrode 13 in the same manner as in the first embodiment. This prevents the solder 6 from transferring stress caused by the difference in thermal expansion between the wiring board 1 and a module substrate 5 to the outer edge portion of the inner electrode 13, and reduces the possibility of the inner electrode 13 coming off the insulating substrate 11. The resultant wiring board can be small and have high circuit density and have highly reliable electrical connection to the module substrate 5 over a long period of time.

In the wiring board 1 according to the third embodiment, the cutout 12 having the shape of a partial hemisphere, which is a semiellipse as viewed from above, may have a depth smaller than a height from the bottom face of the cavity 18 (depth) as in the examples shown in FIGS. 12A to 13. This prevents the strength of the insulating substrate 11 from decreasing, and allows intended formation of the cutout 12 in the lower surface of the insulating substrate 11.

As in the examples shown in FIGS. 12A to 13, the cutout 12 having the shape of a partial hemisphere, which is a semiellipse as viewed from above, may be formed not to overlap the cavity 18. This prevents the strength of the insulating substrate 11 from decreasing, and allows intended formation of the cutout 12 in the lower surface of the insulating substrate 11.

As in the examples shown in FIGS. 12A to 13, the insulating substrate 11 has the upper surface with the cavity 18. The cavity 18 is formed by forming a through-hole that is to be the cavity 18 through ceramic green sheets by laser processing or punching using a die, and laminating these ceramic green sheets on other ceramic green sheets having no through-hole. When the insulating substrate 11 is thin, the ceramic green sheets may be first laminated and then a through-hole for the cavity 18 may be formed in the laminated sheets by laser processing or punching using a die. The through-hole has high accuracy in this case. As in the examples shown in FIGS. 12A to 13, the width of the cutout 12 is about 25 to 75% of that of the side wall of the cavity 18.

When the cavity 18 is intended for containing a light-emitting device, the inner-side face and the bottom face of the cavity 18 form an obtuse angle θ, which may be 110 to 145 degrees. The angle θ set within this range allows stable and efficient formation of the inner surface of a through-hole to be the cavity 18 by punching. The light emitter including this wiring board 1 can thus easily be small. This light emitter can also radiate light emitted from its light-emitting device outwardly. The cavity 18 having an inner surface with this angle θ is formed by, for example, punching a ceramic green sheet using a punching die with a large clearance between the punch diameter and the die hole diameter. More specifically, when the punch is forced through the ceramic green sheet from one main surface to the other main surface with a large clearance between the die hole diameter and the punch diameter of the punching die, the green sheet is sheared from the edge of the punch contact surface toward the edge of the die hole contact surface, and the through-hole diameter widens from one main surface toward the other main surface. Setting the clearance between the punch diameter and the die hole diameter in accordance with, for example, the thickness of the ceramic green sheet adjusts the angle with the inner surface of the through-hole in the ceramic green sheet. This punching method can achieve an intended angle θ between the inner surface of the cavity 18 and the bottom of the cavity 18 without an additional process, and thus has high productivity.

The through-hole with an angle θ widening from one main surface toward the other main surface may be formed with a different method. After a through-hole with an angle θ of about 90 degrees is formed using a punching die with a smaller clearance between the punch diameter and the die hole diameter, a die having the shape of a truncated cone or a truncated pyramid is pressed against the inner surface of the through-hole. In this case, the angle θ formed by the inner-side face of the cavity 18 and the bottom face of the cavity 18 can be adjusted more accurately.

The wiring board 1 including the insulating substrate 11 having the cavity 18 on its upper surface for containing, for example, a light-emitting device may include a reflective layer on the interior wall of the cavity 18 for reflecting light emitted from the light-emitting device. The reflective layer includes, for example, a metal conductor layer formed on the interior wall of the cavity 18 and a plating layer deposited on the metal conductor layer. The metal conductor layer may be formed using the same material and the method as for the inner electrode 13 and the wiring conductor 14 or for the main surface electrode 15.

When, for example, a light-emitting device is mounted on the wiring board 1, a silver plating layer may be deposited on the outermost surface of the metal conductor layer, whereas a gold plating layer may be deposited on the outermost surfaces of the inner electrode 13, the wiring conductor 14, and the main surface electrode 15. The gold plating layer has a higher joining property with the electronic component 2, the connection member 3, and the solder 6 than the silver plating layer, which has a higher light reflectance than the gold plating layer. A wiring in an area for receiving the light-emitting device and the outermost surface of the metal conductor layer may be an alloy plating layer of silver and gold, for example, a sliver-gold alloy plating layer of all-proportional solid solution.

The wiring board 1 according to the third embodiment may be used in a small-size and high-power electronic device as in the first embodiment, and improves the electrical connection of the wiring board 1. For example, the wiring board 1 may be used as a small mount board for a light-emitting device, on which a high output light-emitting device as the electronic component 2 is mounted.

The wiring board 1 according to the third embodiment may be manufactured in the same manner as in the first embodiment.

Fourth Embodiment

Figure 14:
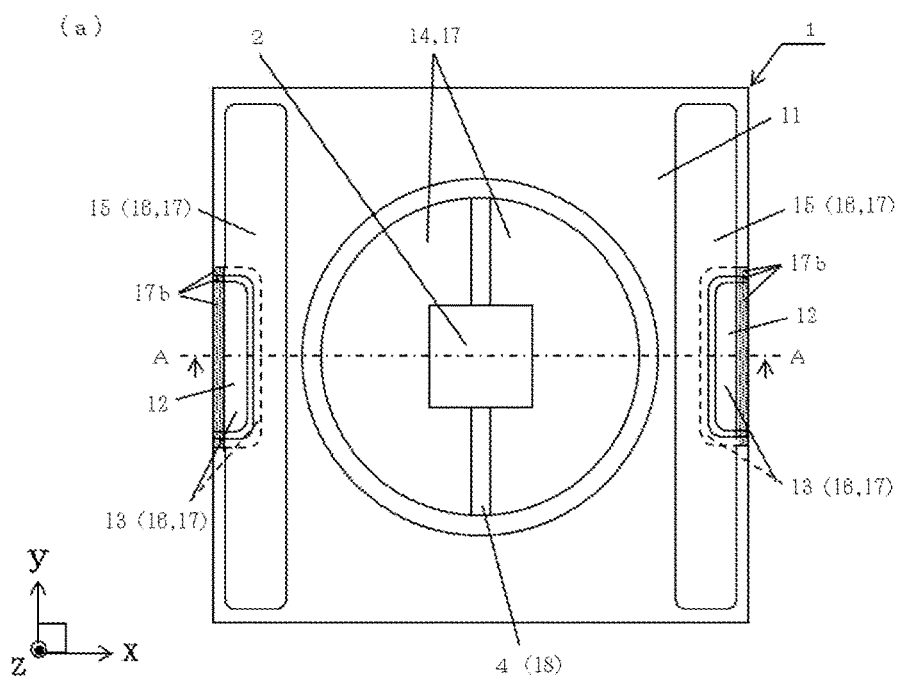
FIG. 14A is a top view of an electronic device according to a fourth embodiment of the present invention.
FIG. 14B is a cross-sectional view taken along line A-A in FIG. 14A.
Figure 14:
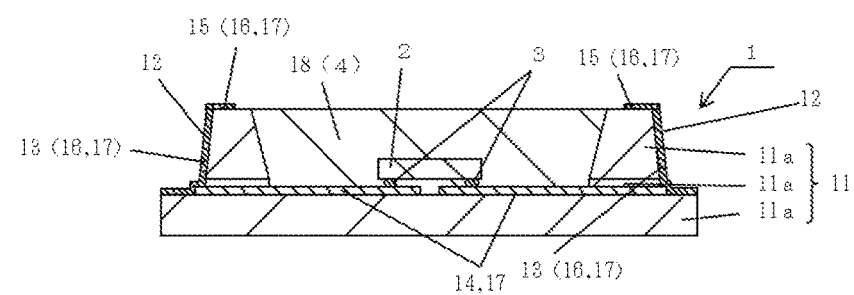

An electronic device according to a fourth embodiment of the present invention will now be described with reference to FIGS. 14A and 14B.

The electronic device according to the fourth embodiment of the present invention differs from the electronic device according to the first embodiment in that each cutout 12 is opened in a side surface and the same main surface (upper surface) as the surface on which the electronic component 2 is mounted as in the example shown in FIGS. 14A and 14B.

The wiring board according to the fourth embodiment of the present invention prevents solder 6 from being applied onto the outer edge portion of an inner electrode 13 in the same manner as the wiring board in the first embodiment. This prevents the solder 6 from transferring stress caused by the difference in thermal expansion between the wiring board 1 and a module substrate 5 to the outer edge portion of the inner electrode 13, and reduces the possibility of the inner electrode 13 coming off the insulating substrate 11. The resultant wiring board can be small and have high circuit density and have highly reliable electrical connection to the module substrate 5 over a long period of time.

This wiring board 1 can be joined at its upper surface to the module substrate 5 with the solder 6. The wiring board 1 can thus have higher heat radiation when a member having a higher thermal conductivity than the insulating substrate 11 is joined to the entire lower surface of the wiring board 1. When the insulating substrate 11 is formed from sintered aluminum oxide, materials having a higher thermal conductivity than the insulating substrate 11 include metal materials such as copper (Cu), copper-tungsten (Cu—W), or aluminum (Al), and insulators of sintered aluminum nitride. This wiring board 1 reduces heat transferred from the electronic component 2 mounted on the wiring board 1 to the cutout 12. The resultant wiring board 1 has high heat radiation and reliability of electrical connection to the module substrate 5 over a long period of time.

The wiring board 1 according to the fourth embodiment may be used in a small-size and high-power electronic device in the same manner as in the first embodiment, and improves the electrical connection of the wiring board 1. For example, the wiring board 1 may be used as a small mount board for a light-emitting device, on which a high output light-emitting device as the electronic component 2 is mounted.

The wiring board 1 according to the fourth embodiment may be manufactured in the same manner as in the second embodiment.

Fifth Embodiment

An electronic device according to a fifth embodiment of the present invention will now be described with reference to FIG. 15.

Figure 15:
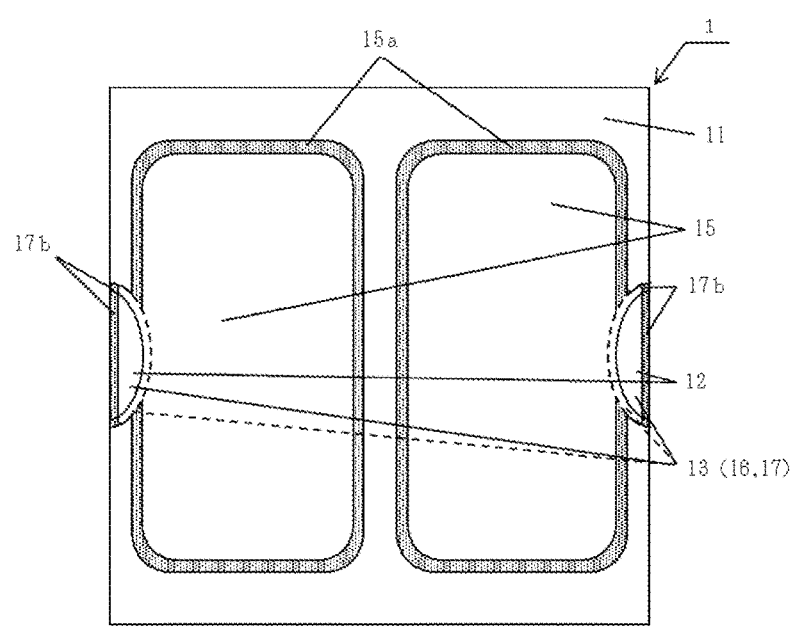
FIG. 15 is a bottom view showing an electronic device according to a fifth embodiment of the present invention.
Figure 15:
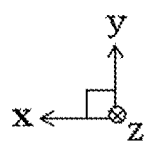

The electronic device according to the fifth embodiment of the present invention differs from the electronic device according to the first embodiment in that at least one metal layer 15a selected from the group consisting of a nickel layer, a chromium layer, a platinum layer, and a titanium layer is exposed at an edge portion of a main surface electrode 15 as in the example shown in FIG. 15.

The wiring board according to the fifth embodiment of the present invention prevents solder 6 from being applied onto the edge portion of the main surface electrode 15. This prevents the solder 6 from transferring stress caused by the difference in thermal expansion between the wiring board 1 and a module substrate 5 to the edge portion of the main surface electrode 15, and reduces the possibility of the main surface electrode 15 coming off the insulating substrate 11. This further prevents a short circuit on the main surface of the insulating substrate 11 in the structure including main surface electrodes 15 arranged at narrow intervals. The resultant wiring board can be small and have high circuit density and have highly reliable electrical connection to the module substrate 5.

The metal layer 15a on the main surface electrode 15 may be formed with the same method as the method for exposing the metal layer 17b on the inner electrode 13.

The wiring board 1 according to the fifth embodiment may be manufactured in the same manner as in the first embodiment.

The present invention is not limited to this embodiment, but may be modified variously. In the examples described above, one cutout 12 and one inner electrode 13 are formed on each of the two facing side surfaces of the insulating substrate 11. However, the wiring board 1 may have one cutout 12 and one inner electrode 13 on each of all the four side surfaces of the insulating substrate 11. The wiring board 1 may also have multiple cutouts 12 and inner electrodes 13 on each side surface. In the examples shown in FIGS. 1A to 15, the insulating substrate 11 includes two or three insulator layers 11a. The insulating substrate 11 may include a single insulator layer 11a or four or more insulating layers 11a.

In the examples shown in FIGS. 1A to 15, each cutout 12 is opened in one of the two main surfaces and the side surface of the insulating substrate 11. However, the cutout 12 may also be opened in the two main surfaces and the side surface of the insulating substrate 11.

As in the examples shown in FIGS. 12A to 13, the wiring board 1 may include conductors other than wiring, or specifically may include an electronic component mount layer 19 and/or a central terminal layer 20. When such conductors each include, for example, a thin-film layer 16 and a plating layer 17, the conductors may be formed using the same material and the method as for the inner electrode 13 and the main surface electrode 15. A conductor formed using the same method as for the wiring conductor 14 may have a metal plating layer 17 on its exposed surface. For example, the electronic component mount layer 19 is used for receiving the electronic component 2, whereas the central terminal layer 20 is used for joining with the module substrate 5 in the same manner as the inner electrode 13 and the main surface electrode 15. As in the example shown in FIGS. 12A and 12B, the central terminal layer 20 may also be connected to the inner electrode 13 on the inner surface of the cutout 12.

The wiring board 1 according to each of the first to fifth embodiments may be flat or may have the cavity 18. The wiring board 1 according to each of the first to fifth embodiments may also include the electronic component mount layer 19 and/or the central terminal layer 20.

In the above example, the single electronic component 2 is mounted on the wiring board 1, but a number of electronic components 2 may also be mounted on the wiring board 1.

The wiring board 1 may also be fabricated as a mother substrate that is to be cut into multiple wiring boards.

REFERENCE SIGNS LIST 1 wiring board
11 insulating substrate
11a insulator layer
12 cutout
13 inner electrode
14 wiring conductor
15 main surface electrode
16 thin-film layer
17 plating layer
17a outermost layer (metal layer)
17b metal layer
18 cavity
19 electronic component mount layer
20 central terminal layer
2 electronic component
3 connection member
4 sealant
5 module substrate
51 connection pad
6 solder

The invention claimed is:

1. A wiring board, comprising:
an insulating substrate having a cutout opened in a main surface and a side surface; and
an inner electrode arranged on an inner surface of the cutout, the inner electrode including a plurality of metal layers,
wherein the inner electrode includes, as an intermediate layer, at least one metal layer selected from the group consisting of a nickel layer, a chromium layer, a platinum layer, and a titanium layer, and includes a gold layer as an outermost layer, and when viewed in a direction perpendicular to the main surface of the insulating substrate, a part of the at least one metal layer extends from an outer edge portion of the gold layer adjacent to the side surface of the insulating substrate toward the side surface of the insulating substrate.

2. The wiring board according to claim 1, wherein
an outer edge portion of the inner electrode adjacent to the side surface of the insulating substrate extends along an opening of the cutout adjacent to the side surface of the insulating substrate.

3. The wiring board according to claim 1, wherein the cutout has a curved inner surface.

4. The wiring board according to claim 1, wherein the cutout has a shape corresponding to a portion obtained by dividing a partial square frustum, and the cutout has an opening width at the main surface greater than a bottom width.

5. An electronic device, comprising:
the wiring board according to claim 1; and
an electronic component mounted on the wiring board and electrically connected to the inner electrode.

6. An electronic module, comprising:
a module substrate including a connection pad on a main surface of the module substrate; and
the electronic device according to claim 5 including the inner electrode connected to the connection pad with solder.

7. The wiring board according to claim 2, wherein
the cutout has a curved inner surface.

8. The wiring board according to claim 2, wherein
the cutout has a shape corresponding to a portion obtained by dividing a partial square frustum, and the cutout has an opening width at the main surface greater than a bottom width.

* * * * *